United States Patent [19]

Donath et al.

[11] 4,263,651

[45] Apr. 21, 1981

[54] METHOD FOR DETERMINING THE CHARACTERISTICS OF A LOGIC BLOCK GRAPH DIAGRAM TO PROVIDE AN INDICATION OF PATH DELAYS BETWEEN THE BLOCKS

[75] Inventors: Wilm E. Donath, Pleasantville; Robert B. Hitchcock, Sr., Binghamton, both of N.Y.

[73] Assignee: International Business Machines Corporation, Armonk, N.Y.

[21] Appl. No.: 40,785

[22] Filed: May 21, 1979

[51] Int. Cl.³ .............................................. G06F 15/46
[52] U.S. Cl. .................................... 364/300; 364/491
[58] Field of Search ......................... 364/300, 490–491

[56] References Cited

U.S. PATENT DOCUMENTS

| T940,008 | 11/1975 | Oden et al. ............................ 364/300 |
| T940,020 | 11/1975 | Brechling et al. .................... 364/300 |
| T943,001 | 2/1976 | Mennone ............................... 364/300 |
| T944,001 | 3/1976 | Hanan et al. .......................... 364/300 |
| 4,027,246 | 5/1977 | Caccoma et al. ................. 364/300 X |

Primary Examiner—Edward J. Wise
Attorney, Agent, or Firm—John J. Goodwin

[57] ABSTRACT

A method is provided which is applied to a logic block diagram, referred to as a block graph, which consists of a plurality of logic blocks interconnected by nets which carry logic signals between the logic blocks. The method is used to determine the characteristics of the given block graph, and more particularly to analyze the block graph to identify critical paths wherein logic signals must arrive at designated blocks at a critical time, and to determine whether the path delays of such critical paths are too long or too short. When critical paths are identified which have path delays that are too long or too short, the block graph can be redesigned to avoid such delays. The method includes three basic, broad steps each of which incorporates a plurality of subsidiary implementation steps. First, from the logic block graph, special blocks defined as storage elements because of their unique function are identified and classified as "level zero" elements. Second, a procedure is carried out which "levelizes" the remaining blocks in the block graph, that is, the blocks will be designated level two, level three, level four etc. in accordance with rules defined within the method. Finally, the long and short path delays, referred to as the extreme characteristics and identified by extreme values are determined for each block in level one, followed by a determination of the extreme characteristics of each block in level two, level three, etc. The extreme characteristics thus identify the critical paths within the logic block which are too long or too short so that a redesign can be made.

7 Claims, 17 Drawing Figures

FIG. 2

LIST OF NETS

| NET SEQUENCE NUMBER | NET NAME | SOURCE BLOCK SEQUENCE NUMBER | SINKS: (BLOCK SEQUENCE NUMBER, RELATIVE INPUT NUMBER ON BLOCK) |
|---|---|---|---|
| 1 | A | 1 | (2,1) , (3,1) |
| 2 | B | 2 | (4,1) |
| 3 | C | 3 | (5,1) , (6,1) |
| 4 | CLOCK | 0 | (3,2) , (4,2) |
| 5 | D | 4 | (6,2) |
| 6 | E | 5 | (7,1) |
| 7 | F | 6 | (7,2) |
| 8 | G | 7 | (1,1) |

FIG. 3A

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | | A | G |
| 2 | | | 0 | | | B | A |
| 3 | STORAGE ELEMENT | 0 | 0 | YES | | C | A,CLOCK |
| 4 | STORAGE ELEMENT | | 0 | | | D | B,CLOCK |
| 5 | | | 0 | | | E | C |
| 6 | | | 0 | | | F | C,D |
| 7 | | | 0 | | | G | E,F |

"IN-PROCESS"

| 3 |
|---|

"TO BE LEVELED"

| |
|---|

L (LEVEL)

| |
|---|

GLOBAL BLOCK ASSIGNMENT FLAG

| |
|---|

LIST OF BLOCKS

| BLOCK NUMBER SEQUENCE | FUNCTION | LEVEL | NEXT BLOCK | FLAGS | | OUTPUT | INPUTS |
| --- | --- | --- | --- | --- | --- | --- | --- |
| | | | | LEVELED | BEING LEVELED | | |
| 1 | | | 0 | | | A | G |
| 2 | | | 0 | | | B | A |
| 3 | STORAGE ELEMENT | | 0 | YES | | C | A, CLOCK |
| 4 | STORAGE ELEMENT | | 0 | | | D | B, CLOCK |
| 5 | | | 0 | | YES | E | C |
| 6 | | | 0 | | | F | C, D |
| 7 | | | 0 | | | G | E, F |

"IN-PROCESS"

3

"TO BE LEVELED"

5

L (LEVEL)

GLOBAL BLOCK ASSIGNMENT FLAG

FIG. 3C

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | | A | G |
| 2 | | | 0 | | | B | A |
| 3 | STORAGE ELEMENT | 0 | 0 | YES | | C | A,CLOCK |
| 4 | STORAGE ELEMENT | | 0 | | | D | B,CLOCK |
| 5 | | | 6 | | YES | E | C |
| 6 | | | 0 | | YES | F | C,D |
| 7 | | | 0 | | | G | E,F |

"IN-PROCESS"

| 3 |
|---|

"TO BE LEVELED"

| 5 |
|---|

L (LEVEL)

|   |
|---|

GLOBAL BLOCK ASSIGNMENT FLAG

|   |
|---|

FIG. 3D

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | | A | G |
| 2 | | | 0 | | | B | A |
| 3 | STORAGE ELEMENT | 0 | 4 | YES | | C | A,CLOCK |
| 4 | STORAGE ELEMENT | 0 | 0 | YES | | D | B,CLOCK |
| 5 | | | 6 | | YES | E | C |
| 6 | | | 0 | | YES | F | C,D |
| 7 | | | 0 | | | G | E,F |

"IN-PROCESS"

| 3 |
|---|

"TO BE LEVELED"

| 5 |
|---|

L (LEVEL)

| 1 |
|---|

GLOBAL BLOCK ASSIGNMENT FLAG

| RESET |
|---|

FIG. 3E

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | | A | G |
| 2 | | | 0 | | | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 0 | YES | | E | C |
| 6 | | | 7 | | YES | F | C,D |
| 7 | | | 0 | | YES | G | E,F |

"IN-PROCESS"

| 3 |
|---|

"TO BE LEVELED"

| ~~0~~ 6 |
|---|

L (LEVEL)

| 1 |
|---|

GLOBAL BLOCK ASSIGNMENT FLAG

| SET |
|---|

FIG. 3F

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | | A | G |
| 2 | | | 0 | | | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 6 | YES | | E | C |
| 6 | | 1 | 0 | YES | | F | C,D |
| 7 | | | 0 | | | G | E,F |

"IN-PROCESS"

| 3 |
|---|

"TO BE LEVELED"

| ∅,∅,7 |
|---|

L (LEVEL)

| 1 |
|---|

GLOBAL BLOCK ASSIGNMENT FLAG

| SET |
|---|

FIG. 3G

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | | A | G |
| 2 | | | 0 | | | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 6 | YES | | E | C |
| 6 | | 1 | 7 | YES | | F | C,D |
| 7 | | 2 | 0 | YES | | G | E,F |

"IN-PROCESS"

| 3 |
|---|

"TO BE LEVELED"

| 5̸,6̸,7̸ |
|---|

L (LEVEL)

| 1̸,2 |
|---|

GLOBAL BLOCK ASSIGNMENT FLAG

| RESET |
|---|

FIG. 3H

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | YES | A | G |
| 2 | | | 0 | | | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 6 | YES | | E | C |
| 6 | | 1 | 7 | YES | | F | C,D |
| 7 | | 2 | 0 | YES | | G | E,F |

"IN-PROCESS"

| 3 |
|---|

"TO BE LEVELED"

| 5̸,6̸,7̸,1 |
|---|

L (LEVEL)

| 1̸,2 |
|---|

GLOBAL BLOCK ASSIGNMENT FLAG

| SET |
|---|

FIG. 3H.1

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | | 0 | | YES | A | G |
| 2 | | | 0 | | | B | A |
| 3 | STORAGE ELEMENT | 0 | 4 | YES | | C | A, CLOCK |
| 4 | STORAGE ELEMENT | 0 | 5 | YES | | D | B, CLOCK |
| 5 | | 1 | 6 | YES | | E | C |
| 6 | | 1 | 7 | YES | | F | C, D |
| 7 | | 2 | 0 | YES | | G | E, F |

"IN-PROCESS"

| 3 |
|---|

"TO BE LEVELED"

| 5̸, 6̸, 7̸, 1 |
|---|

L (LEVEL)

| 1̸, 2̸, 3 |
|---|

GLOBAL BLOCK ASSIGNMENT FLAG

| RESET |
|---|

FIG. 3I

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | 3 | 0 | YES | | A | G |
| 2 | | | 0 | | YES | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 6 | YES | | E | C |
| 6 | | 1 | 7 | YES | | F | C,D |
| 7 | | 2 | 1 | YES | | G | E,F |

"IN-PROCESS"

| 3 |
|---|

"TO BE LEVELED"

| 5̸,6̸,7̸,1̸,2 |
|---|

L (LEVEL)

| 1̸,2̸,3 |
|---|

GLOBAL BLOCK
ASSIGNMENT FLAG

| SET |
|---|

FIG. 3I.1

LIST OF BLOCKS

| BLOCK NUMBER SEQUENCE | FUNCTION | LEVEL | NEXT BLOCK | FLAGS | | OUTPUT | INPUTS |
| --- | --- | --- | --- | --- | --- | --- | --- |
| | | | | LEVELED | BEING LEVELED | | |
| 1 | | 3 | 0 | YES | | A | G |
| 2 | | | 0 | | YES | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 6 | YES | | E | C |
| 6 | | 1 | 7 | YES | | F | C,D |
| 7 | | 2 | 1 | YES | | G | E,F |

"IN-PROCESS"

| 3 |
|---|

"TO BE LEVELED"

| 5̸,6̸,7̸,1̸,2 |
|---|

L (LEVEL)

| 1̸,2̸,3̸,4 |
|---|

GLOBAL BLOCK ASSIGNMENT FLAG

| RESET |
|---|

FIG. 3J

LIST OF BLOCKS

| BLOCK NUMBER SEQUENCE | FUNCTION | LEVEL | NEXT BLOCK | FLAGS | | OUTPUT | INPUTS |
|---|---|---|---|---|---|---|---|
| | | | | LEVELED | BEING LEVELED | | |
| 1 | | 3 | 2 | YES | | A | G |
| 2 | | 4 | 0 | YES | | B | A |
| 3 | STORAGE ELEMENT | 0 | 4 | YES | | C | A,CLOCK |
| 4 | STORAGE ELEMENT | 0 | 5 | YES | | D | B,CLOCK |
| 5 | | 1 | 6 | YES | | E | C |
| 6 | | 1 | 7 | YES | | F | C,D |
| 7 | | 2 | 1 | YES | | G | E,F |

"IN-PROCESS"

| 3 |
|---|

"TO BE LEVELED"

| 5̸,6̸,7̸,1̸,2̸,0 |
|---|

L (LEVEL)

| 1̸,2̸,3̸,4 |
|---|

GLOBAL BLOCK ASSIGNMENT FLAG

| SET |
|---|

METHOD FOR DETERMINING THE CHARACTERISTICS OF A LOGIC BLOCK GRAPH DIAGRAM TO PROVIDE AN INDICATION OF PATH DELAYS BETWEEN THE BLOCKS

DESCRIPTION

1. Technical Field

The present invention relates to methods and procedures for the design and layout of large scale logic circuits, and more particularly to a method for analyzing a logic block graph diagram and determining critical paths between blocks which have path delays which are too long or too short.

2. Background Art

The problem of designing a logic block graph within a timing limitation (i.e. early and late signal arrival times) has been known in the prior art and discussed, for example, in the publication "Design Verification At The Register Transfer Language Level" by H. Hoehne and R. Piloty, IEEE Transactions on Computers, September 1975.

The prior art work has centered on the analysis of the detailed electrical properties of the components along a path or have taken the delays of the blocks to be well-defined numbers and optimized these delays within a power constraint.

The publication "High-Speed Calculation Of The Critical Paths Of Large Networks" by M. Montalbano, IBM Systems Journal, Vol. 6, No. 3, 1967 at pages 163–190 discusses a one-phase calculation method for critical path analysis. The methods steps employed are set forth in detail in the publication and are quite distinct from the method of the present invention. In the Montalbano publication and other prior art there is no teaching of cutting loops or levelizing the block graph as an independent step. Furthermore, the method of the present invention has less block processing steps and is therefore less time consuming and more efficient than the prior art techniques.

BRIEF DESCRIPTION OF THE DRAWINGS

FIG. 2 is a "List of Nets" tabulation used in the explanation of the method of the present invention.

FIGS. 3A through 3J provide a "List of Blocks" tabulation used in the explanation of the method of the present invention. As the tabulation increases during the steps of the method, the block list of FIG. 3A is updated to FIG. 3B, then to FIG. 3C etc.

DISCLOSURE OF THE INVENTION

In large scale integrated circuit arrays, great numbers of logic blocks are provided and are connected to each other by complicated networks, feedback loops and the like. The blocks include multiple input pins and output pins which are connected to output pins and input pins of pluralities of other selected blocks in the logic block diagram or block graph. In an actual embodiment of a block graph, signal delays are caused by the physical interconnections between the blocks and by the logic elements within the blocks. In the design and layout of the blocks and interconnections of an integrated circuit array, it is very important that the logic block graph for the circuit be analyzed to determine whether signals which are intended to arrive at a logic block at the same time for combination or interaction purposes or for clocking will actually do so. If, as a result of path delays which are relatively too long or too short, the signals are not available at a designated logic block for combination, interaction or clocking then the entire logic array will not function correctly.

The circuit paths that carry signals which must arrive at designated blocks at a critical time are referred to as critical paths, and one of the uses of the method of the present invention is to identify such critical paths and determine whether the critical path delays are too long or too short in a particular block graph.

Prior to describing a typical implementation of the method of the present invention, it is desirable to set forth definitions of certain terms which will be used in the description.

| | |
|---|---|
| Block: | An element, a plurality of which are interconnected to form a block graph. An element may have one or more inputs and one or more outputs. Typically, blocks perform logic functions such as adding, multiplying etc. Each input to a block is fed by a net, and each output from a block feeds its own net, such that a block output functions as a source for a net. A block includes a function code specifying its function such that a block representing a storage element can be distinguished. |
| Storage Element: | A special block recognizable by its unique function code. |
| Net: | A net carries signals from a source block (there is one source per net) to the block inputs (also referred to as "sinks" of the net). |
| Block Graph: | A collection of blocks interconnected by nets to provide a logic circuit function. |
| External-input: | An input to a block is an "external-input" if the source for the net feeding that input is not present within the block graph. The net feeding this block input pin is also referred to as a "primary-input". |
| Leveled-input: | An input to a block is a "leveled-input" if the source block for the net feeding that input has already been assigned to some level. |

Figure 1:
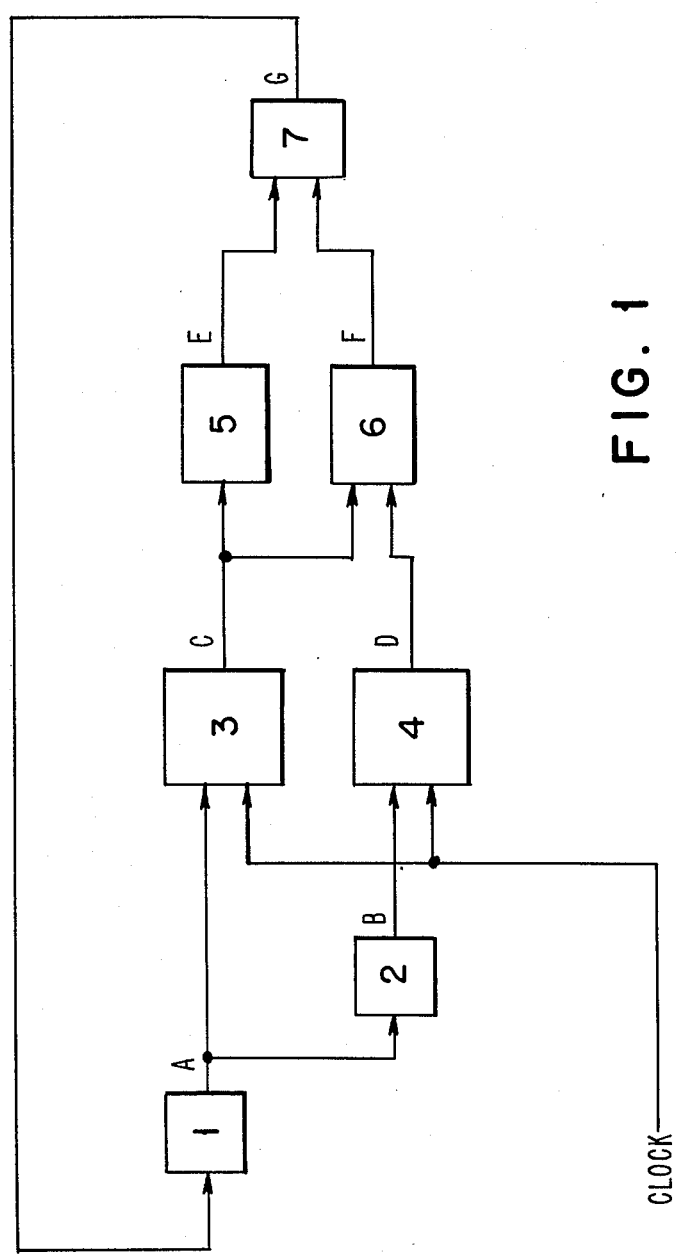
FIG. 1 is a schematic illustration of a representative logic block graph used in explaining the principles of the method of the present invention.
Figure 3B:
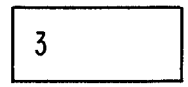
Figure 3B:
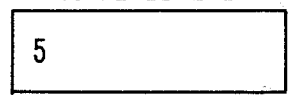
Figure 3B:
Figure 3B:

Referring now to FIG. 1, a typical block graph is schematically illustrated showing blocks interconnected by nets. Certain typical features should be noted relative to the block graph of FIG. 1. From each net all the sinks, or block inputs, fed by such net can be accessed and retrieved as well as the source, or block output, which feeds such net. From each block, the net fed by such block output and the net feeding each input of such block can be accessed and retrieved. All the blocks and nets are accessible and may be arranged in individual lists, so it is possible to discuss processing each block. Also, each block data area contains enough spare storage area to permit storing a pointer to the next block in a processing sequence to form a "chain", and more particularly in the present example, an "in-process chain". Each block is initially assumed to point to no block, therefore the "in-process" chain is empty. In addition to a pointer each block stores a number describing the level to which the block has been assigned (referred to as the "level-number") and flags that indicate (a) if the block has been assigned to a level (initially assumed to be NO) and (b) if a block has been already added to a "to-be-leveled" sequence or chain (referred to as the "being-leveled-flag").

The aforesaid remarks will be better understood in the context of the following example of the steps of the method. The method is described relative to the block graph of FIG. 1 and the List of Nets and the List of Blocks set forth in FIG. 2 and 3 respectively. For convenience, the blocks illustrated in FIG. 1 are designated 1, 2, 3, 4, 5, 6 and 7 from left to right in the drawing and the nets are designated A, B, C, D, E, F, G and "clock", also on a convenient left-to-right basis. The nets are listed to FIG. 2 and the blocks are listed in FIG. 3. The information set forth in the List of Nets of FIG. 2 is obtained by observation of the block graph of FIG. 1. For example, it can be seen that the first net in the sequence is net A, it is fed from source block 1, and it serves as the input to block 2 and block 3. At the start of the method steps, the rest of the lists of FIG. 2 and FIG. 3 are completely empty and will be filled in as the method is carried out. From FIG. 1 it is seen that each block feeds the net indicated next to its output and designated with a alphabet letter. In the List of Blocks (FIG. 3), in the "output column", the output nets are entered which correspond to the source block for each net. The correspondence between the source blocks and the output nets in FIG. 3 are also set forth in the List of Nets (FIG. 2) where the nets are specified and the source blocks therefor are listed. Thus, there is a correlation between FIGS. 2 and 3 and in carrying out the method of the invention it will be useful to go back and forth between the two lists. It is noted that "clock" is an external input and therefore has no designated source block, but is considered to be a net which serves as an input to blocks 3 and 4.

Step one in the present method is to determine or form the levels for each of the blocks of the block graph. Each of the logic blocks contain storage areas in which information can be written. One unit of information consists of flags which indicate whether the each block is "being-leveled" or has been "leveled". If the block has been "leveled" its level number is stored therein. Also, each block stores a pointer which points to or designates the next block in the leveling sequence. Initially, all blocks in the graph contain no level number and point to no subsequent block.

The method also requires that an external storage means be provided for storing four units of information: "in-process" information which is the number of the first block in the chain of blocks which have been leveled, "to-be-leveled" information which is the number of the first block in the list of blocks which are candidates for being leveled, "level" information, which is the number of the level which has been arrived at thus far in the processing or leveling, and a "global flag" which indicates for each pass through the leveling process whether additional blocks have been leveled.

In the first step of the method, which is to obtain the level of each of the blocks of the block graph, storage elements are initially identified by their unique stored function code. The storage element is then added to the end of an "in-process chain". An "in-process chain" is a threaded list of blocks (i.e. a sequence or sub-list within a block graph) wherein the "in-process" information points to the first block in the chain and each block points to the next block in the chain by means of its stored pointer. Since, in the present example, the "in-process" information and all the pointers in the blocks are set to zero, adding the first storage element to the end of the empty chain is effectively the same as placing the storage element at the beginning. Next, the "leveled" flag of the first storage element is set and the level-number is set to zero. Finally, each block fed by the net fed by each output of the storage element is looked at.

Step 1: Thus, in summary, if a block in the block graph is a storage element, the following sub-sets or procedures are performed:
(a) add the storage element to the end of the "in-process" chain";
(b) set the "leveled" flag;
(c) set the level-number to ZERO;
(d) look at each block fed by the net fed by each output of the storage element.

If the block fed is not already on the "to-be-leveled" chain (as indicated by the block's "being-leveled" flag) and the block being fed is not a storage element (as indicated by the block function) then the block being fed is added to the "to-be-leveled" chain by doing i and ii.
(i) Set the "being-leveled" flag;
(ii) Add the block to the end of the "to-be-leveled chain" (similar to a) above).

Now all the storage elements are on the in-process-chain and Step 1 has been completed.

Step 2: Increment the "level to be assigned" storage means to ONE. The value in the "level to be assigned" storage means will be hereinafter referred to as "L".

Step 3: Process each block on the "to-be-leveled" chain. For each such block, if every input to such block is either a primary-input or a leveled-input (from a block whose level is less than L) then the following steps A, B, C, D, E, F, G are performed:
(A) Remove the block from the to-be-leveled chain;
(B) Reset the being-leveled-flag;
(C) Set the leveled-flag;
(D) Assign the level-number "L" to the block;
(E) Add the block to the end of the in-process chain;
(F) Look at each new block fed by the net fed by each output of the block just processed.

If the new block fed is not already on the to-be-leved chain (as indicated by its "being-leveled-flag") and it is not a storage element and it is not already leveled (as indicated by its "leveled-flag") then the new block is added to the "to-be-leveled chain" by doing (i') and (ii').
(i') Set the being-leveled flag in block (the new block).
(ii') Add the new block to the end of the to-be-leveled chain.
(G) Set a global block assignment flag (to be later explained) to indicate that at least one block has been assigned to level L.

Note: At this point we will have added the blocks in level L which have been added to the "in-process chain"—in effect the Lth level has been created. Now a decision must be made whether another level is in order.

Step 4: If at least one block has been assigned to Level L and the to-be-leveled chain is not empty, the following steps are performed:
(A') Reset the global block assignment flag;
(B') Increment L to the value L+1;
(C') Go back and re-do Step 3 (in effect, to create level L+1).

On the other hand:
Step 5: If no block was assigned to Level L or the to-be-leveled chain is empty, the preparation process terminates.

Referring again to FIGS. 1, 2 and 3 in view of the method steps described hereinabove, it is seen that block 3 is a storage element (as identified by its stored unique function code in the second column of FIG. 3A on the row associated with block 3.

Since block 3 is a storage element, substep (a) of Step 1 is performed, adding block 3 to the end of the "in-process chain" by entering the number "3" in the "in-process" storage (illustrated as a box in FIG. 3A). In accordance with Step 1 (b), the "leveled" flag is set to some positive indication to denote a YES. This is illustrated in the fifth column of FIG. 3A. Then, following the method to Step 1 (c), the level for block 3 is set to "0" (third column of FIG. 3A) and then, according to Step 1 (d) each block fed by the net which is fed by the output of block 3 is processed. As previously explained in the definitions, the block outputs feed nets and the nets feed sinks which are really nothing more than the inputs to blocks being fed. In the present example block 3 only has one output net, namely net C, as seen from (FIG. 1 and tabulated in the seventh column of FIG. 3A).

Referring to FIG. 2 it is seen from the fourth column that net C feeds two blocks; block 5 and block 6. Considering the first one, block 5: two conditions must be checked. The first check is to insure that block 5 is not on the "being leveled" chain (i.e. by checking its "being leveled" indication tabulated in the sixth column of FIG. 3A) and insuring that block 5 is not a storage element (i.e. by checking the absence of the unique storage element function code in the second column in FIG. 3A.)

Since block 5 is not a storage element and is not on the "being leveled" chain, block 5 is thus added to the "being leveled" chain which involves doing both i and ii of steps 1. Doing i sets the being-leveled flag for block 5, and doing ii adds block 5 to the end of the to-be-leveled chain by placing the index of block 5 in the "to-be-leveled" storage block. The results of these steps are shown in the sixth column and the "to-be-leveled" storage block on the list of blocks as newly illustrated in FIG. 3B, which is an updated version the same block list of FIG. 3A. Block 5 will be the first block in the chain at this stage in the process; any other block that is added after that but before block 5 is deleted, will be added to the end of the chain which will be accomplished by placing a block number in the "next block" (fourth) column. At this point the process is complete for block 5 which was the first sink for net C where C was the output of the storage element 3.

As illustrated in FIG. 2, the next sink fed by net C is block 6. Block 6 must go through the same set of tests that were applied to block 5. The first check is to make sure that is is not already on the to-be-leveled chain (it is not) and to check that is is not a storage element (it is not). So since block 6 is not a storage element and not on the to-be-leveled chain, parts i and ii of step 1 are performed which first sets the being-leveled flag (as shown in the sixth column of FIG. 3C), and adds the block to the end of the to-be-leveled chain. The to-be-leveled chain points to block 5 and since in this instance, block 5 also happens to be the end of the chain, the zero in the "next block" column (fourth column) for block 5 is replaced by the number 6 (as shown in the fourth column of FIG. 3C). This continues the chain so that 6 is now the block at the end of the to-be-leveled chain. This completes the processing of the sinks fed by net C. Since C was the only output of storage element 3 this also completes the processing of storage element 3.

Since the next block in the sequence (block 4) also happens to be a storage element (as noted from the information entered in the second column) as shown in FIG. 3D and the same steps are followed, that is, Steps 1, a through d. Step 1a involves the addition of block 4 to the end of the in-process chain. The in-process chain currently points to block 3 which has a zero as its next block pointer which indicates that it is the end of the chain. Replacing the zero with a "4" in a manner similar to the to-be-leveled chain, extends the chain and now block 4 is the last block in the chain. This change is shown in the fourth column for block 3 in FIG. 3D. At this point, the leveled flag for block 4 is set (fifth column of FIG. 3D), the level number is set to "0" (third column of FIG. 3D) and the process proceeds by looking at the blocks fed by the output of storage element 4. From FIG. 3D it is seen that the output net fed by block 4 is net D. From FIG. 2 it is seen that net D feeds one block, which is block 6. As before, the first step is to check to see if block 6 is on the to-be-leveled chain. The "being-leveled flag" for block 6 (sixth column of FIG. 3D) indicates that it is and since that is the only block fed by net D and net D is the only output from block 4, the process continues by checking the remainder of the list. At this point, all of the storage elements in the list have been processed, so Step 1 is complete.

Since all the storage elements are in the in-process chain, the procedure continues with Step 2 which simply initializes the value of the current level, L, to be 1 and resets the Global Flag (as shown in the L (level) storage block at the bottom of FIG. 3D).

Step 3 considers each block in the to-be-leveled chain. For each block in the to-be-leveled chain two conditions are checked: every input to the block must be an external input (primary input) or an input from a leveled block whose level is less than the value in the L (level) storage block. The first block on the to-be-leveled chain is block 5 whose only input is net C, as shown in the eighth column of FIG. 3D. Net C's source is block 3 (as shown in FIG. 2), and block 3 is on level zero (as shown in the fourth column of FIG. 3D) and zero is less than L which is currently set to one. Since the preconditions for Step 3 were all passed, the substeps A, B, C, D, E, F and G of Step 3 will be followed.

Substep 3A: The block being processed (block 5) is removed from the to-be-leveled storage chain (by removing the "5" in the to-be-leveled storage box and entering the block number which block 5 points to into that box). Since block 5 points to block 6, 6 is placed in the "to-be-leveled" box as shown in FIG. 3E, and Substep B: reset block 5's being-leveled flag (sixth column, FIG. 3E).

Substep C: set block 5's leveled flag (fifth column, FIG. 3E).

Substep D: assign the level number (1) to the block being processed, (block 5) as shown in the third column, FIG. 3E.

Now that block 5 has been assigned to level 1, it is added to the end of the in-process chain. The in-process chain starts at 3, block 3 points to 4 which is the current end of the chain. Block 5 is added to the end of the chain by setting the "next block" value for block 4 to "5" and the "next block value" for block 5 to zero (fourth column, FIG. 3E).

Substep F: using FIG. 1 look at each block which is fed by net E, which is the output of block 5. From the net list (FIG. 2), net E feeds one input of block 7. At this point in the process, check to see (in FIg. 3E) that block 7 is not already on the to-be-leveled chain (true), that block 7 is not a storage element (true), and that block 7 is not already leveled (true). These things all being true (as indicated in FIG. 3E), the substeps i' and ii' of Step 1 will be followed. Substep i': block 7's "being-leveled" flag is set (as shown in the sixth column of FIG. 3E).

Substep ii: add block 7 to the end of the to-be-leveled chain.

The to-be-leveled chain currently points to block 6 which is also the end of the chain) so the value in block 6 is changed to point to block 7 (as shown in the fourth column of FIG. 3E).

Substep G: set the global block assignment flag to indicate that something has been set to this level (bottom of FIG. 3E).

Restarting Step 3, the next block in the "to-be-leveled" chain is block 6, as shown in the "to-be-leveled" storage block of FIG. 3E. Block 6 is fed by nets C and D (see FIG. 1) which are fed from blocks 3 and 4, both of which are at level zero (which is less than L) and therefore block 6 will be considered and the method will follow substeps A, B, C, D, E, F, G of Step 3.

Substep A: remove block being processed (block 6) from the to-be-leveled chain. At this point, block 6 is the first one in the chain. So by moving the value that's pointed to by 6 to the to-be-leveled box (zero), block 6 is eliminated from the chain. The process of replacing the first-element pointer by the pointer contained in the first element (as was just done) eliminates the first element from the chain. Thus, the "7" in the "next block" column (fourth column of FIG. 3F for block 6) is replaced with "0" and "7" is placed in the "to-be-leveled" storage box (FIG. 3F).

Substep B: reset block 6's being-leveled flag, a shown in FIG. 3F.

Substep C: set the leveled flag for block 6, as shown in FIG. 3F.

Substep D: assign the level number of block 6 to 1, as shown in the third column of FIG. 3F, and Substep E: add block 6 to the end of the in-process chain. The current last entry in that chain is block 5 so change the zero in block 5's "next block" column (third column of FIG. 3F) to "6". (Now block 6 will be the last block in the chain).

Substep F: using FIGS. 3 and 2, which are related to the logic block graph of FIG. 1, look at everything that block 6 feeds. Block 6 feeds net F which feeds block 7. Block 7 is checked to see if it's already on the to-be-leveled chain (which it is, as indicated by the "being leveled" indication in the sixth column of FIG. 3F), so no more needs to be done with block 7.

Substep G: set the global block assignment flag (again) because one more block has been added to this level. The next block on the to-be-leveled chain is block 7. Block 7 does not have any primary inputs but it does have a leveled input. The inputs to block 7 (as seen in FIG. 1) are nets E and F which come from blocks 5 and 6, respectively, both of which are at level 1 which is the same as L, not less than L. This means that block 7 cannot be processed by Step 3, and since there are no other entries on the to-be-leveled chain, the process proceeds to Step 4. At this point the two blocks just added to the leveled chain (Blocks 5 and 6) constitute all the blocks in level 1.

Step 4: decide whether it may be necessary to process any Level 2 blocks. If at least one block has been assigned to level 1 (true because the global block assignment flag is in the set condition, see FIG. 3F), and the to-be-leveled chain is not empty, (it isn't, it points to block 7), then Substep A: reset the global block assignment flag, see FIG. 3G, Substep B: increment L to L+1 in the L (level) storage block as shown in FIG. 3G, and Substep C: go back and re-do step 3. This means that L will be set to 2 (as shown in FIG. 3G) and the entire to-be-leveled chain will be reprocessed by step 3. The very first block in the to-be-leveled chain is block 7. Double checking the conditions for step 3, note that block 7 still has no primary inputs but since its leveled inputs come from blocks 5 and 6 which are in level 1 and L is now equal to 2, block 7 can now be processed.

Substep A: remove block 7 from the "to-be-leveled" chain. This can be done by simply changing the to-be-leveled box to point to the block pointed to by block 7 (which is zero). Since zero is not a real block in the graph this signals the end of the chain.

Substep B: reset the being-leveled flag for block 7, as shown in the sixth column of FIG. 3G.

Substep C: set block 7's leveled-flag, as shown in the fifth column of FIG. 3G.

Substep D: assign level 2 to block 7, as shown in the third column of FIG. 3G.

Substep E: add block 7 to the end of the in-process chain which starts with block 3, 3 points to 4, 4 points to 5, 5 points to 6, 6 points to zero (signalling the end). Replacing the zero with "7" in the "next block" column (fourth column of FIG. 3G) for block 6 adds block 7 to the end of the chain.

Substep F: using FIGS. 2,3, look at the blocks which are fed by block 7. Block 7 feeds net G which feeds block 1 which is not on the to-be-leveled chain, is not a storage element and has not already been leveled.

Substeps i' and ii': add block 1 to the to-be-leveled chain, as shown in FIG. 3H, and set the being-leveled flag as well, as shown in the sixth column for block 1 in FIG. 3H.

Substep G: set the global block assignment flag to indicate that something has been assigned to level 2. Continuing step 3, the next block in the to-be-leveled chain is now block 1.

Verifying the conditions for step 3, block 1 is not fed by any primary inputs but the leveled input to it is from net G which is fed by block 7, which is in level 2, which is not less than L.

Step 4: Since the global block assignment flag is in the set condition, at least one block has been assigned to level L, and additionally the to-be-leveled chain is not empty, therefore continue with substeps A', B' and C' of Step 4.

Substeps A', B' & C': reset the global assignment flag, change L from 2 to 3, as shown in FIG. 3H.1, and go back and redo step 3.

Step 3: process each block in the to-be-leveled chain (the only block is block 1). Block 1 still has no primay inputs but its leveled input comes from a block at level 2 which is now less than L so the process is free to continue.

Substep A: remove block 1 from the to-be-leveled chain. This means (as before) that the next block value for block 1 will be put in the to-be-leveled chain in the place where the "1" was found.

Substep B: reset block 1's being-leveled flag, as shown in FIG. 3I,

Substep C: set the leveled flag for block 1 (fifth column of FIG. 3I),

Substep D: assign the value of L, (3) to block 1's level number (third column of FIG. 3I), and Substep E: add block 1 to the end of the in-process chain which currently ends at block 7. (i.e., set block 7's "next block" value to the number 1, as shown in the fourth column of FIG. 3I and block 1's "next block" value to zero). Looking at each block fed by net A which is the output of block 1, net A feeds blocks 2 and 3. First checking block 2, it is not in the to-be-leveled chain, is not a storage element, and is not already leveled so therefore it can be processed.

Substep i and ii: set block 2's being-leveled flag, as shown in the sixth column of FIG. 3I, and add the block to the end of the to-be-leveled chain which currently is empty. ("2" is placed in the to-be-leveled box to start the chain).

Block 3 (the second sink fed by net A) is not on the to-be-leveled chain but it is a storage element and it has been leveled. So therefore, block 3 can not be processed further. That's the last sink fed by net A and that's the only output from block 1 so the processing for block 1 is complete. Substep G: set the global block assignment flag to indicate something has been placed in level 3.

Step 3: the next block on the to-be-leveled chain is block 2 which has no primary inputs feeding it, but does have an input from net A whose source is block 1 whose level is 3. So since the level for block 1 is not less than L, block 2 cannot be processed just yet.

Step 4: increment the level number to 4, reset the global assignment flag, and proceed back to re-do step 3 (FIG. I.1).

Step 3: block 2 (the only block on the to-be-leveled chain) is fed by net A whose source is block 1 which is in level 3. Since 3 is less than L, block 2 can now be processed.

Substep A: Remove block 2 from the to-be-leveled chain (take the value that is in the next block field for 2 and place it in the to-be-leveled box).

Substep B: reset the "being-leveled" flag (sixth column, FIG. 3J).

Substep C: set the leveled flat (fifth column, FIG. 3J),

Substep D: assign block 2 to level 4 (third column, FIG. 3J),

Substep E: add block 4 to the end of the in-process chain, the end of the chain is currently at block 1 so block 1's "next block" column will be set to 2.

Substep F: The blocks which are fed by the output from block 2 (net B) consists of only block 4. Block 4 is not on the to-be-leveled chain but it is a storage element so block 4 is not processed by i and ii.

Substep G: set the global block assignment flag (FIG. 3J). Net B was the only output from block 2 so step 3 is complete and the process moves on to Step 4. The global block assignment flag tells us that at least one block was assigned to level 4 but the to-be-leveled chain is empty. Since the to-be-leveled chain is empty, the process does not go back to step 3, but continues on to step 5 where termination of this phase in the process is indicated. Thus, the "leveling" of the blocks in the block graph of the example (FIG. 1) has been accomplished using the general method described and only the data contained in the lists of FIGS. 2 and 3.

Note, that the in-process chain which starts with block 3 lists in order the blocks, starting with level 0, and continuing with levels 1, 2, 3, and 4 which is exactly the order desired for processing the blocks by the next stage of the algorithm. The next phase of the method, the determination of the extreme characteristics, will now be described.

To determine the extreme characteristics of the logic circuit, the extreme value of each of the blocks of the block graph is determined, beginning with the blocks in level 1, then proceeding to level 2 blocks, level 3 blocks, etc. The order in which the blocks in any level is processed is unimportant, and each block in the block graph is processed only once.

It should be noted that a block in level 1 will have inputs only from primary inputs or storage element outputs. A block in level 2 will have inputs from primary inputs, storage element outputs or outputs from blocks from level 1. A block in level 3 will have inputs from primary inputs, storage element outputs, or outputs from blocks from levels 1 and 2, etc.

Therefore, when a block in any level is being processed, the "extreme values" for all the blocks (i.e., signals) coming from other blocks, primary inputs or storage elements which feed that block will be known. Thus, all the values at each input for the block being processed are known.

An "extreme value" as used in the present invention refers to a general function depending on the user's application or need and may, for example, be a time value such as a maximum signal delay or a minimum signal delay.

Considering any block (b), one extreme value for the output of (b) is the last or latest time a signal can get to the output of block (b).

Figure 4:
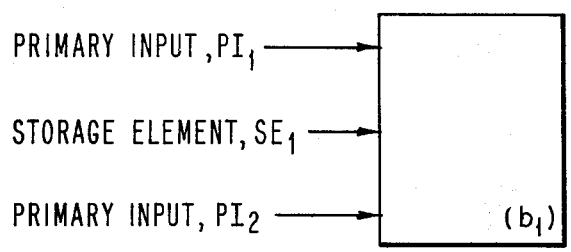
FIGS. 4, 5 and 6 are block diagrams used in explaining the determination of the extreme characteristics which forms a part of the method of the present invention.

Referring to FIG. 4, the typical level 1 block (b) is illustrated as having as inputs a first primary input $PI_1$, an input from a storage element $SE_1$ and a second primary input $PI_2$. The times at which the signals will arrive at block (b), if they arrive at all, may be, for example, $t(PI_1) = 3$ units of time $t(SE_1) = 7$ units of time $t(PI_2) = 5$ units of time The delay through the block (b) itself may be, for example, equal to 4 units of time for each of the three inputs. However in the general case the internal delay in block (b) could be different for each of the inputs. Thus, primary inputs could be delayed in block (b) a different amount of time than storage element inputs.

Using the latest time a signal can get to the output of block (b) of FIG. 4 as the "extreme value", such an "extreme value" is expressed extreme value = delay $(b)$ + max $(t_{(PI_1)}, t_{(SE_1)}, t_{(PI_2)})$ extreme value = 4 + max (3,7,5)

extreme value = 4 + 7 = 11 units of time

Another "extreme value" may be the earliest time a signal can appear at the output of block (b) which would be extreme value = delay $(b)$ + min $(t_{PI_1}, t_{(SE_1)}, t_{(PI_2)})$ extreme value = 4 + min (3,7,5)

extreme value = 4 + 3 = 7 units of time

In the disucssion to follow, the "extreme values" will be the latest times that signals appear at the outputs of the blocks in the block graph. It was just indicated how a latest time for a first level block was determined to be 11 units of time. Assume that level 1 of a given block graph included a second block which was found, in a similar process manner, to have a latest time (i.e., "extreme value") of 10 units of time. Assume also that level 1 contains only such first and second blocks. Therefore all the blocks of level 1 have been processed and level 2 can be considered. (It should be noted that the order in which the two blocks in level 1 were processed is immaterial).

Figure 5:
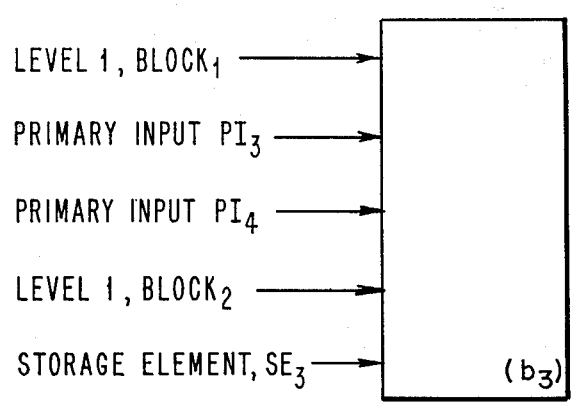

FIG. 5 illustrates a typical level 2 block having five inputs, two of which are the outputs from the level 1 blocks and the other inputs are from primary inputs and a storage element. The time values are set forth as follows:

$t(level_1\ block_1) = 11$ units of time
$t(PI_3) = 9$ units of time
$t(PI_4) = 8$ units of time
$t(level_1\ block_2) = 10$ units of time
$t(SE_3) = 7$ units of time The block of FIG. 5 will have its own internal delay, for example a maximum of 5 units of time.

The times for $PI_3$, $PI_4$ and $SE_3$ were given as internal conditions and the times for the level 1 blocks were calculated when the level 1 blocks were processed as described. Because of the previous leveling portion of the present method, it is known that no other signals can feed a level 2 block other than primary inputs, storage elements, or outputs from level 1 blocks (which, as described, have already been processed.)

Now, the extreme (max) time for the level 2 block ($b_3$) of FIG. 5 is expressed extreme value = delay $(b_3) + \max(t_{(b1)}, t_{PI3}, t_{(PI4)}, t_{b2}, t_{(SE3)})$ extreme value = $5 + \max(11, 4, 8, 10, 7) = 5 + 11 = 16$ Similarly, the rest of the level 2 blocks are processed, the latest times are determined and the process continues to level 3. A level 3 block can have inputs from primary inputs, storage elements (given as initial conditions) and from level 1 and/or level 2 blocks whose extreme (max) values were determined by the previous processing steps. Thus, the extreme values of the blocks in level 3 can be determined in the same manner as the blocks in levels 1 and 2. In like manner, the level 4 blocks, level 5 blocks, and so on are processed until the last or final level has been processed. The result is a tabulation of extreme (max) values, one for each block in each level of the block graph.

The use or interpretation of the extreme values depends largely on the actual function used as the single block computation function. In the chosen example, selecting "max" as the "extreme function" required the computation, for each block in any level, of the latest possible time at which any signal can arrive at the output of a block by any path originating at a primary input or storage element output. Of particular interest is the value determined for those blocks which can be designated "primary outputs" because, if the block graph is a design for the logic on a chip, the primary output times will be those times when the signals arrive at the outputs of the chip.

It should be emphasized that to obtain the extreme values, each block in each level of the block graph is processed only once since a block can be located in only one level. Also, the blocks in each level can be processed in any desired order. In prior art techniques for determining extreme values, normally a primary output is selected and a trace back through all its inputs, and the inputs inputs is carried out. Thus, since the trace back must be made through all paths that feed a primary output, the number of paths that must be traced increases exponentially and each block in the block graph may be calculated and recalculated many times.

Figure 6:
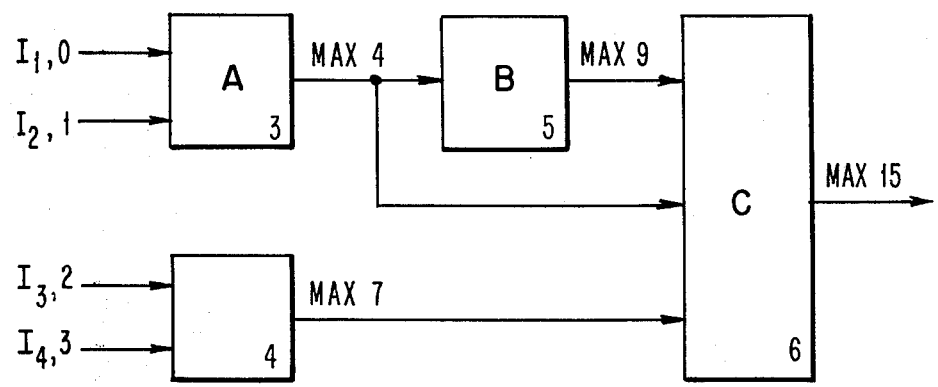

An object of the present invention has been previously stated to be to provide an indication of path delays between blocks in a block graph. Thus far the description of the method has been directed to the processing of the blocks in a block graph. However, the results obtained by processing the blocks is in fact the desired indication of path delays. This can be illustrated by referring to the typical block graph of FIG. 6. On a path basis, an extreme value (max) is considered to be the last or latest time a signal can get through a block, and this value is the sum of the internal delay through the block plus the latest arrival time of the signals which are the inputs to the block. For example, if a block has an internal delay of 6 time units and has three inputs the signals on which arrive at 3, 5 and 7 units of time respectively, then the "extreme value" or latest time through the block is $6 + 7 = 13$ units of time. In FIG. 6, it is assumed that $I_1$ has a latest time of 0, $I_2$ has a latest time of 1, $I_3$ a latest time of 3 and $I_4$ a latest time of 3. Block A has a delay of 3 units of time, block B has 5 units, block C has 6 units and block D has 4 units.

On a path basis, six calculations are required to consider all paths through the four blocks, as follows:

| | | |
|---|---|---|
| $I_1 + A + B + C$ | $= 0 + 3 + 5 + 6$ | $= 14$ units of time |
| $I_2 + A + B + C$ | $= 1 + 3 + 5 + 6$ | $= 15$ units of time |
| $I_1 + A + C$ | $= 0 + 3 + 6$ | $= 9$ units of time |
| $I_2 + A + C$ | $= 1 + 3 + 6$ | $= 10$ units of time |
| $I_3 + D + C$ | $= 2 + 4 + 6$ | $= 12$ units of time |
| $I_4 + D + C$ | $= 3 + 4 + 6$ | $+ 13$ units of time |

The maximum of the six calculations is 15 units of time, which is the maximum path delay through the logic block graph.

Using the method of the present invention, the logic graph is first cut and leveled and it is determined that blocks A and D are in level 1, block B is in level 2 and block C is in level 3. The blocks are processed as follows:

Level 1 extreme (max) value $A =$ delay $(A) + \max(I_1, I_2) = 3 + 1 = 4$ units of time extreme (max) value $D =$ delay $(D) + \max(I_3, I_4) = 4 + 3 = 7$ units of time Level 2 extreme (max) value $B =$ delay $(B) + (level_1\ block\ A) = 5 + 4 = 9$ units of time Level 3 extreme (max) value $C =$ delay $(C) + \max$ (level 1 block $A$, level 1 block $D$, level 2 block $B$) $= 6 + \max (4, 7, 9) = 15$ units of time Thus the extreme (max) value of 15 units of time is the same as determined by the path basis, however only four block process steps are required after the initial cutting and leveling as opposed to six calculations for the path basis. FIG. 6, however, represents a very simple example, and for complex block graphs with many blocks and paths the saving in calculation steps and time using the present method is appreciably greater.

What has been demonstrated in the foregoing example is that the extreme (max) values at each block are really the extreme values over all the possible paths that get to the output of each block. This can also be shown mathematically. Assume for a block (b) that each input is either (a) a primary input, (b) a storage element output or (c) a block from a previous level which has at its output the extreme value already selected for all possible paths to that block output. The extreme (max) value for all possible paths through this block (b) will delay (b)+max (a) all PIs, (b) all SEs, (c) all input blocks).

However, for level 1, all inputs are (a) or (b) and are known, and the process can be carried out for level 1 and will give the same result as on a path basis. For level 2, all inputs are (a), (b) or (c) where (c) are all level 1 blocks. Thus, the block processing can be carried out on level 2 to give the same extreme (max) value for the path basis. Thus, if the proposition is true for level 2 it is true for level 3 where all level 3 block inputs are (a), (b) or (c) when (c) is the inputs from level 2 or level 1 blocks). Generally, therefore, the proposition is true for level K+1 where all inputs are (a) (b) or (c) where (c) are inputs from level 1,2,3, . . . K blocks.

What has been described as a method for determining the characteristics of a logic circuit of the type used in large scale integrated circuits to provide an indication of the characteristics of the circuit arrangement, such as the path delays between the circuit elements. To effect the method, the logic circuit may be represented by a logic block graph and the basic method steps of levelizing and determining the extreme characteristics can be performed. It will be appreciated by one skilled in the art that the processing steps of the described method can be carried out with the aid of presently known data processing techniques using a digital or analog computer to further reduce the time needed to perform the method steps.

While the invention has been particularly shown and described with reference to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for determining critical paths within a logic block circuit of the type including a plurality of functional logic block elements interconnected by a plurality of input and output signal conductor paths wherein said plurality of logic blocks includes blocks having a storage element function and wherein said logic block circuit also includes external input conductor paths connected to given ones of said blocks, comprising levelizing of said logic blocks and determining the extreme characteristics of said logic blocks, said levelizing procedure including the steps of:

A. recording in a record means a first list consisting of said logic blocks of said block circuit wherein each of said logic blocks is assigned a different number of a numerical sequence in said list and wherein each of said storage element blocks in said list is designated as a storage element by a unique indicator, B. selecting from said record means one of said storage element logic blocks recorded in said numerical list and recording in said record means said selected storage element logic block as the initial entry in a second list referred to as an "in-process chain", and assigning a level number "L" of ZERO to said storage element logic block in said second list and designating in said second list that said storage element logic block has been assigned a level, C. selecting each logic block in said logic block circuit having an input conductor connected to an output conductor of said ZERO level number storage element and recording in said record means each said selected logic blocks in a third list referred to as a "to-be-leveled" chain, D. determining from said logic block circuit those logic blocks listed in said "to-be-leveled chain" third list which have other input conductors which are connected only to external input conductors and to output conductors from zero level number logic blocks, and removing such determined logic blocks from said "to-be-leveled chain" third list in said record means, E. assigning a level number "L" of ONE to each of said logic blocks determined in step D, adding said logic blocks to said "in-process chain" second list on said record means, and designating in said second list that said logic blocks have been assigned a level number "L" of ONE, F. determining from said logic block circuit each of those logic blocks having input conductors connected to output conductors from said logic blocks previously determined in step D and which are not recorded on said "to-be-leveled chain" third list and which are not storage element blocks and which do not have a level number "L" assigned thereto and recording each of said determined logic blocks in said "to-be-leveled chain" third list in said record means, G. and continually repeating steps E and F for the remaining blocks in said logic block circuit and increasing said level number "L" by one increment for each repeat until no block is assigned to the last incremented level number values or no blocks remain listed in said "to-be-leveled chain" third list such that all said logic blocks in said logic circuit have been assigned to a level designated by a level number "L" wherein level ZERO blocks are storage element blocks, level ONE blocks have inputs only from external input conductors and storage element block outputs, and blocks assigned to successive levels have inputs only from external input conductors, storage element blocks and outputs from logic blocks of proceeding levels.

2. A method according to claim 1 wherein steps C and F include the sub-step of recording in said record means a "global block assignment" indication to indicate that at least one logic block has been assigned a level "L" and wherein step D and G include the sub-step of removing said "global block assignment" indication from said record means when said level "L" has been increased by one increment, "said global block assignment" indication serving to provide an indication when a level has been reached to which no logic blocks have been assigned so that steps F and G are no longer repeated.

3. A method according to claim 1 wherein said steps C and F include the sub-step of recording in said record means a "being-leveled" indication for each logic block recorded in said "to-be-leveled" third list.

4. A method according to claim 3 wherein said steps E and G include the sub-step of removing from said record means said "being-leveled" indication and recording a "leveled" indication for each of said logic blocks which have been assigned a level number "L".

5. A method according to claim 1 wherein each of said logic blocks including said storage element blocks of said logic block circuit have a specified internal function value effecting the passage of a signal to the output conductors of said blocks referred to as block function value, and wherein each of said external input conductors to said logic blocks have a specified input function valve effecting signals applied as inputs to said logic blocks, said extreme characteristic determination procedure of the method of claim 1 including the steps of:

H. from said specified input function values of said external input conductors connected as inputs to said logic blocks assigned to level ONE and from said specified block function values of said ZERO level storage elements connected as inputs to said level ONE logic blocks, in combination with said block function values of said level ONE logic blocks connected to said external input conductors and storage elements, determining output function values for the outputs of each of said logic blocks assigned to level ONE, one of which output function values for each level ONE logic block being the most extreme of said block output function values, I. from said specified input function values of said external input conductors connected as inputs to logic blocks assigned to level TWO from said specified block function values of said ZERO level storage elements connected as inputs to said level TWO logic blocks and from said outputs of said level ONE logic blocks connected as inputs to said level TWO logic blocks, combined with said block function values of said level TWO logic blocks, determining output function values for the outputs of each of said logic blocks assigned to level TWO, one of which output function values for each level TWO block being the most extreme of said block output function values, and continually repeating step I for determining the output function values for each of the logic blocks assigned to successive levels of said logic block circuit, using said specified input function values of said external input conductors, said specified block function values of said ZERO level storage element blocks and said determined output function values of said preceding level logic blocks which are connected as inputs to said successive level logic blocks until the output function value including the extreme output function value for each of said logic blocks in each of said levels of said logic block circuit has been determined.

6. A method according to claim 5 wherein said specified internal function value is the amount a signal is time delayed in each of said logic blocks, wherein said input function value of said external input conductors is the arrival time of a signal at a logic block connected to said external input conductors, wherein said output function values for the outputs of said logic blocks are the arrival times of the signals to said logic blocks combined with said time delay in said logic blocks, and wherein said extreme output function value is the maximum time delay at the output of each logic block as a factor of the said combination of the latest arrival time of an input signal to each block and the amount said latest arrived signal is time delayed in each logic block.

7. A method according to claim 5 wherein said specified internal function value is the amount a signal is time delayed in each of said logic blocks, wherein said input function value of said external light conductors is the arrival time of a signal at a logic block connected to said external input conductors, wherein said output function values for the outputs of said logic blocks are the arrival times of the signals to said logic blocks combined with said time delay in said logic blocks, and wherein said extreme output function value is the minimum time delay at the output of each logic block as a factor of the said combination of the earliest arrival time of an input signal to each block and the amount said earliest arrived signal is time delayed in each logic block.

* * * * *

UNITED STATES PATENT AND TRADEMARK OFFICE
CERTIFICATE OF CORRECTION

PATENT NO. : 4,263,651

DATED : April 21, 1981

INVENTOR(S) : W. E. Donath and R.B. Hitchcock, Sr.

It is certified that error appears in the above-identified patent and that said Letters Patent is hereby corrected as shown below:

Column 9, line 42, delete "flat" and insert--flag--

Column 13, line 13, delete "will delay" and insert --will be delay--

Column 15, line 14, delete "valve" and insert --value--

Column 16, line 34, delete "light" and insert --input--

Signed and Sealed this

Third Day of September 1985

[SEAL]

Attest:

DONALD J. QUIGG

Attesting Officer    Acting Commissioner of Patents and Trademarks - Designate